(12) United States Patent  (10) Patent No.: US 7,751,190 B2
Fujiwara  (45) Date of Patent: Jul. 6, 2010

(54) ELECTRONIC DEVICE

(75) Inventor: Nobuto Fujiwara, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 146 days.

(21) Appl. No.: 12/039,651

(22) Filed: Feb. 28, 2008

(65) Prior Publication Data

US 2008/0257529 A1 Oct. 23, 2008

(30) Foreign Application Priority Data

Apr. 20, 2007 (JP) ............................. 2007-112257

(51) Int. Cl.
*H05K 7/20* (2006.01)
(52) U.S. Cl. ...................... 361/700; 361/695; 361/697; 361/699; 174/15.2; 165/104.21; 165/104.22; 165/104.26; 165/80.4
(58) Field of Classification Search ................. 361/699, 361/700, 719; 174/15.1, 15.2; 257/714, 257/715; 165/80.4, 104.33, 104.26
See application file for complete search history.

(56) References Cited

U.S. PATENT DOCUMENTS

| 6,621,698 | B2* | 9/2003 | Chang ................... 361/679.47 |
| 6,880,626 | B2* | 4/2005 | Lindemuth et al. ...... 165/104.26 |
| 6,945,317 | B2* | 9/2005 | Garner et al. .......... 165/104.26 |
| 7,124,809 | B2* | 10/2006 | Rosenfeld et al. ....... 165/104.26 |
| 7,212,404 | B2* | 5/2007 | Wang et al .................. 361/697 |
| 7,248,473 | B2* | 7/2007 | Ohnishi et al. .............. 361/695 |
| 7,312,985 | B2* | 12/2007 | Lee et al. ............... 361/679.48 |
| 7,325,590 | B2* | 2/2008 | Kim et al. ............. 165/104.33 |
| 7,339,787 | B2* | 3/2008 | Cheng et al. ................ 361/695 |
| 7,466,548 | B2* | 12/2008 | Ishikawa .................... 361/698 |
| 2007/0131383 | A1* | 6/2007 | Hattori et al. .............. 165/11.2 |
| 2007/0177350 | A1* | 8/2007 | Hata et al. .................. 361/697 |
| 2007/0195500 | A1* | 8/2007 | Cheng et al. ................ 361/697 |

FOREIGN PATENT DOCUMENTS

| JP | 374864 | 3/1991 |
| JP | 2000-214958 | 8/2000 |
| JP | 2006-13217 | 1/2006 |

* cited by examiner

*Primary Examiner*—Boris L Chervinsky
(74) *Attorney, Agent, or Firm*—Knobbe, Martens, Olson & Bear LLP

(57) ABSTRACT

An electronic device includes a cabinet, a first heat generating member, a second heat generating member, a fan unit, a first heat pipe and a second heat pipe. The first and second heat pipes are each formed by sealing an operation fluid which shifts its phase between gas and liquid into a pipe-like main body. In the second position, the first end portion of the first heat pipe is located at a position lower than that of the second end portion and the one end portion of the second heat pipe is located at a position higher than that of the other end portion. The second heat pipe includes a conveying mechanism that conveys the operation fluid in liquid phase from the other end portion to the one end portion.

6 Claims, 7 Drawing Sheets

ELECTRONIC DEVICE

CROSS-REFERENCE TO RELATED APPLICATIONS

This application is based upon and claims the benefit of priority from prior Japanese Patent Application No. 2007-112257, filed Apr. 20, 2007, the entire contents of which are incorporated herein by reference.

BACKGROUND OF THE INVENTION

1. Field of the Invention

One embodiment of the invention relates to an electronic device equipped with a cooling device.

2. Description of the Related Art

For example, Jpn. Pat. Appln. KOKAI Publication No. 2000-214958 discloses an electronic device equipped with a cooling device. This electronic device includes a cabinet, a heat sink installed inside the cabinet and containing a heat receiving unit thermally connected to a heat generating member and a heat exchange unit formed on the heat receiving unit, a fan unit provided on the heat sink, a first heat pipe that conveys heat of the heat exchange unit to the vicinity of the fan unit, a second heat pipe thermally connected to the heat sink and a heat radiating plate connected to a tip end of the second heat pipe. The first heat pipe and the second heat pipe each comprises a cylindrical heat pipe main body and a liquid operating fluid sealed inside the heat pipe main body.

In this electronic device, the heat generated from the heat generating member is transferred to the heat sink through the heat receiving unit. The heat transferred to the heat sink is discarded to the outside of the cabinet by air sent the fan unit. At the same time, in this electronic device, the second heat pipe is connected to the heat sink, and therefore the heat of the heat sink is transferred via the second heat pipe to the heat radiating plate. Thus, the conventional electronic device employs two heat pipes so as to improve the cooling efficiency of the heat generating member.

It is known that a heat pipe of such a type which transports heat by an operating fluid sealed inside as described above has an angle dependency. More specifically, when the heat pipe is installed in a vertical direction, the circulation of the operating fluid is disturbed and therefore such a phenomenon "top heat" occurs, in which the heat conductivity is not exhibited. In order to prevent the top heat, it is necessary to devise designing for the arrangement of the heat pipe. However, the conventional electronic device is not made based on the technical concept or even suggestion for preventing the occurrence of the top heat, and it cannot attend such a problem when the top heat occurs.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION OF THE PREFERRED EMBODIMENT

Various embodiments according to the invention will be described hereinafter with reference to the accompanying drawings. In general, according to one embodiment of the invention, an electronic device includes a cabinet, a first heat generating member, a second heat generating member, a fan unit, a first heat pipe and a second heat pipe. The first and second heat pipes are each formed by sealing an operation fluid which shifts its phase between gas and liquid into a pipe-like main body. In the second position, the first end portion of the first heat pipe is located at a position lower than that of the second end portion and the one end portion of the second heat pipe is located at a position higher than that of the other end portion. The second heat pipe includes a conveying mechanism that conveys the operation fluid in liquid phase from the other end portion to the one end portion.

Figure 1:
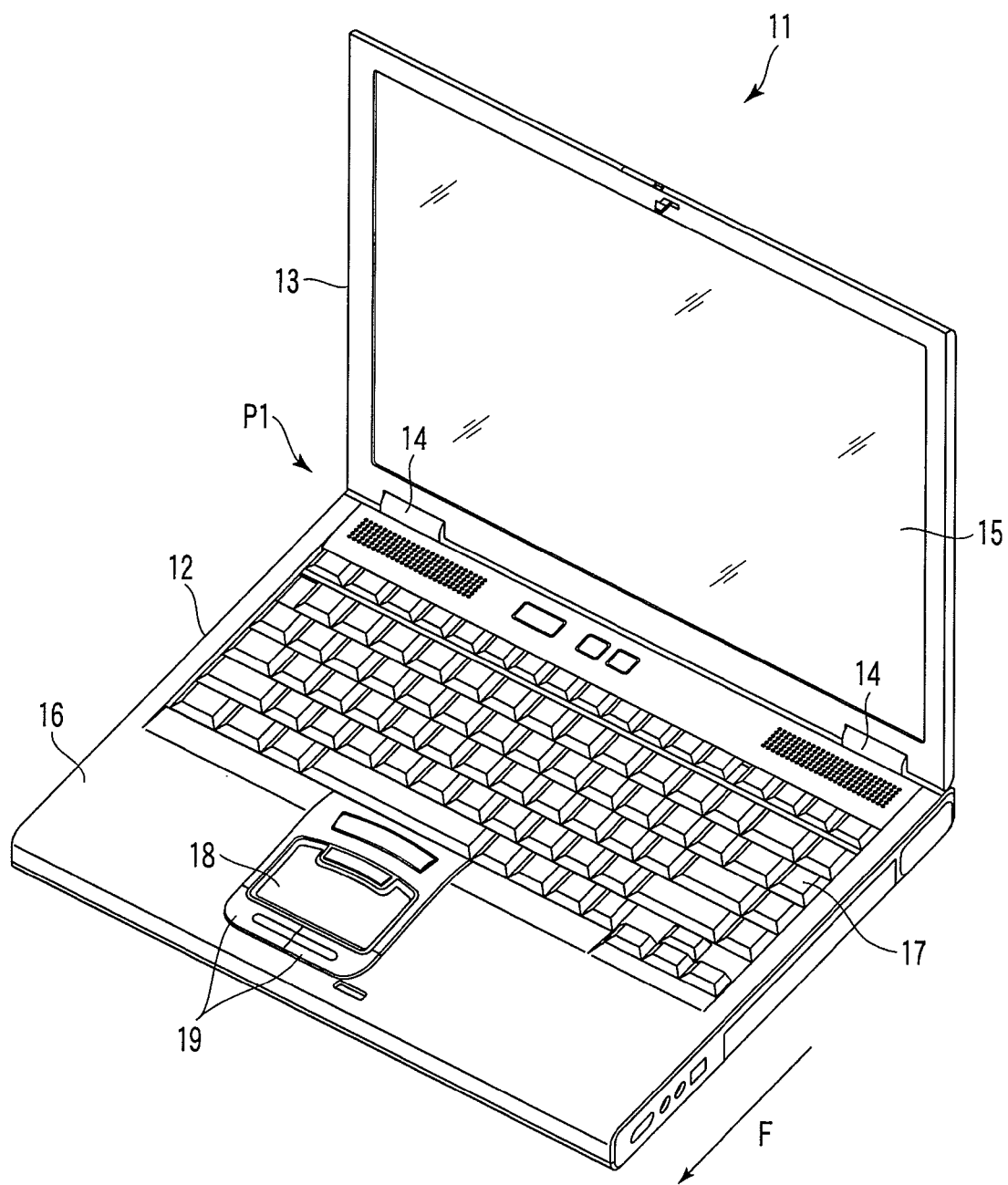
FIG. 1 is an exemplary perspective view of a portable computer which is an example of the electronic device according to the first embodiment.

An embodiment of the electronic device will now be described with reference to FIGS. 1 to 5. As shown in FIG. 1, a portable computer 11, which is an example of the electronic device, includes a main body unit 12, a display unit 13 and a hinge mechanism 14 provided between the main body unit 12 and the display unit 13. The hinge mechanism 14 supports the display unit 13. As can be seen in FIG. 1, the forward direction F is as indicated on the side close to the operator.

Figure 5:
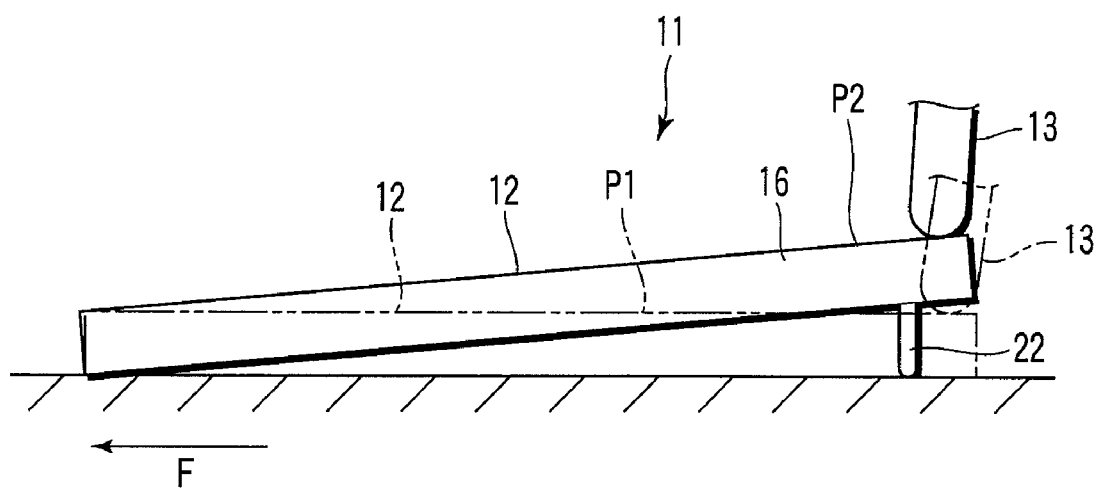
FIG. 5 is an exemplary lateral view showing a first position and a second position of the portable computer shown in FIG. 1.

The display unit 13 includes a display 15. The display 15 is, for example, a liquid crystal display. As shown in FIGS. 1 and 5, the main body unit 12 includes a resin-made cabinet 16, a keyboard 17, a touch pad 18, which is a pointing device, buttons 19, a printed circuit board 20 housed inside the cabinet 16, a cooling device 21 that cools down a circuit component 32 of the printed circuit board 20 and leg members 22 that can change the height of the cabinet 16. The leg members 22 are provided on a bottom part of the cabinet 16, and they are pivotable around an axial portion which is not in the figure. As shown in FIG. 5, the leg members 22 can be set to stand up from the cabinet 16 or retracted inside the cabinet 16 within its thickness. As the leg members 22 are set to stand up from the cabinet 16, the placement angle of the keyboard 17 can be changed.

Figure 2:
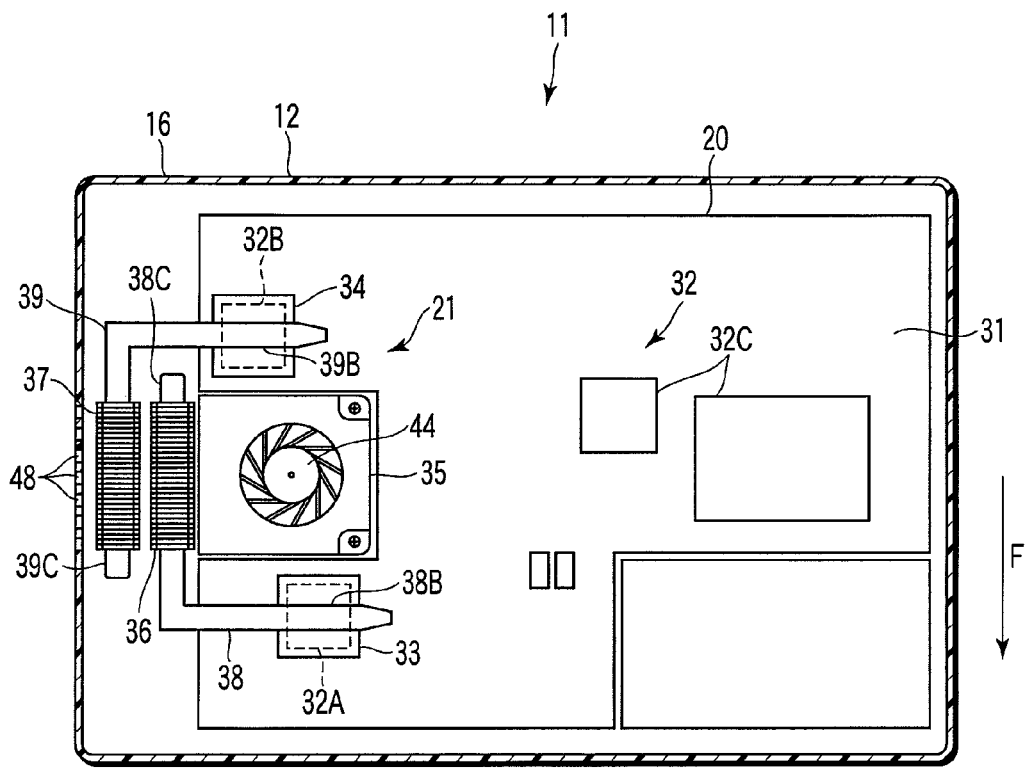
FIG. 2 is an exemplary cross sectional view of a cabinet of the portable computer shown in FIG. 1 when it is cut in its horizontal direction.

As can be seen in FIG. 2, the printed circuit board 20 includes a printed wiring board 31 in which copper-made wiring layers are stacked, and a plurality of circuit parts 32 mounted on the printed wiring board 31. These circuit parts 32 includes a first heat generating member 32A, a second heat generating member 32B and other parts 32C. The first heat generating member 32A is, for example, a ball grid array (BGA) type semiconductor package, which contains a central processing unit (CPU) or the like. The second heat generating member 32B is, for example, a BGA type semiconductor package, which contains a graphic chip or the like. It should be noted that the first heat generating member 32A and the second heat generating member 32B are not limited to these units, but they may be some other parts including a north bridge.

The cooling device 21 is designed to cool down the first heat generating member 32A and the second heat generating member 32B of the circuit parts 32. The cooling device 21 includes a first heat receiving plate 33 thermally connected to the first heat generating member 32A, a second heat receiving plate 34 thermally connected to the second heat generating member 32B, and a fan unit 35 that promotes the cooling down of the first and second heat generating members 32A and 32B. The cooling device 21 further includes a first heat sink 36 and a second heat sink 37 provided in the vicinity of the fan unit 35, a first heat pipe 38 which connect the first heat receiving plate 33 and the first heat sink 36 to each other and a second heat pipe 39 which connect the second heat receiving plate 34 and the second heat sink 37 to each other.

The first heat receiving plate 33 and the second heat receiving plate 34 are each made of a copper plate into a square shape. The first heat sink 36 and the second heat sink 37 are each formed of a plurality of square plate-like fins which are joined together. The first heat sink 36 is provided to be adjacent to the second heat sink 37. The fan unit 35 includes a fan main body 44, a motor that rotates the fan main body 44, and the like.

The first heat pipe 38 includes a first main body 38A which is made of copper into a tubular shape. Inside the first main body 38A, an operating fluid which can shifts its phase between the gaseous state and liquid state is sealed. The operating fluid is, for example, water. It should be noted that the operating fluid is not limited to water, but it may be some other medium such as alcohol. The first heat pipe 38 is placed in the cabinet 16 to extend substantially in the horizontal direction. The first heat pipe 38 includes a first end portion 38B to be connected to the first heat generating member 32A and a second end portion 38C located in the neighborhood of the fan unit 35. The second end portion 38C is connected to the first heat sink 36.

Figure 3:
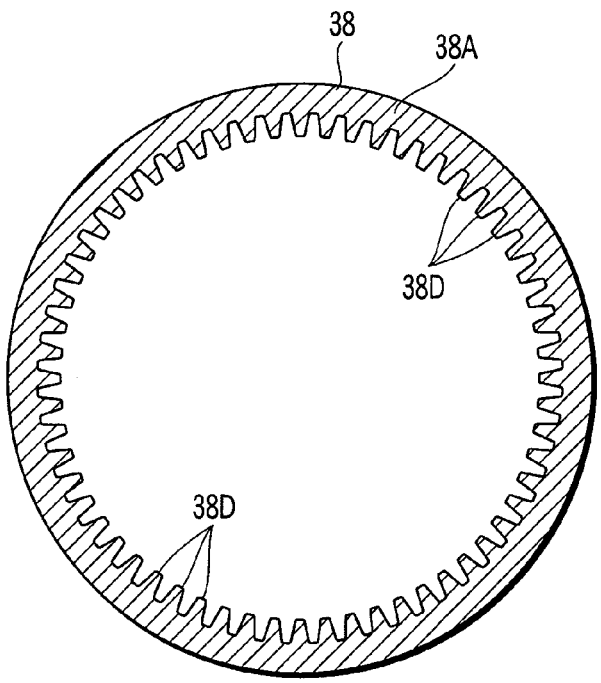
FIG. 3 is an exemplary cross sectional view of a first heat pipe of the portable computer shown in FIG. 2.

As can be seen in FIG. 3, the first heat pipe 38 includes inside the first main body 38A a plurality of groove portions 38D, which serves as a first conveying mechanism. These groove portions 38D are formed to extend along the longitudinal direction of the first heat pipe 38. The groove portions 38D are formed to be integral with the first main body 38A.

The operating fluid can change its phase between the gas state and liquid state. In the first heat pipe 38, the operating fluid gasifies in the vicinity of the first end portion 38B connected to the first heat receiving plate 33 and thus the heat of the first heat receiving plate 33 is absorbed. The operating fluid (in the gaseous state) liquefies in the second end portion 38C connected to the first heat sink 36 and the heat absorbed in the first heat pipe 38 is released to the first heat sink 36.

Figure 4:
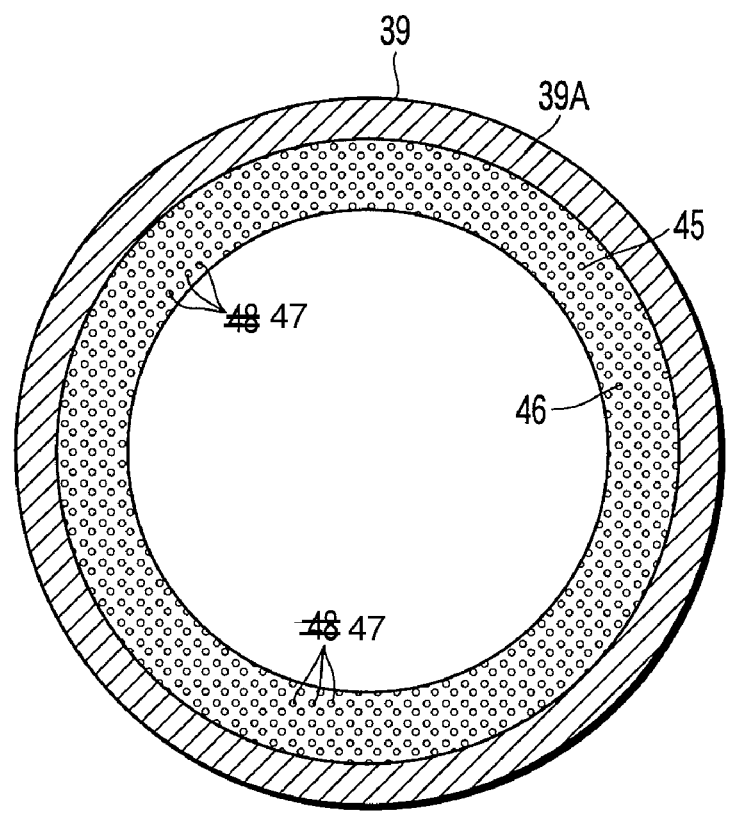
FIG. 4 is an exemplary cross sectional view of a second heat pipe of the portable computer shown in FIG. 2.

As shown in FIGS. 2 and 4, the second heat pipe 39 includes a second main body 39A which is made of copper into a tubular shape. Inside the second main body 39A, an operating fluid of the same type as that of the first heat pipe 38 is sealed. The second heat pipe 39 includes an end portion 39B to be connected to the second heat generating member 32B and another end portion 39C located in the neighborhood of the fan unit 35. The other end portion 39C is connected to the second heat sink 37.

The second heat pipe 39 includes a conveying mechanism 45, which is the second conveying mechanism. The conveying mechanism 45 is a porous layer 46 formed to have a predetermined thickness on an inner circumferential portion of the second main body 39A. The porous layer 46 has a number of micro-pores 47 which are communicated to each other. Thus, the operating liquid is allowed to pass through the micro-pores 47. The porous layer 46 is formed, for example, by sintering a layer of copper particles formed on the inner circumferential portion of the second main body 39A. The diameter of the micro-pores 47 of the second heat pipe 39 is extremely small as compared to the width of the groove portions 38D of the first heat pipe 38. With this structure, the second heat pipe 39 can exhibit a sufficient capillary effect.

In the second heat pipe 39, the operating fluid gasifies in the vicinity of the one end portion 39B connected to the second heat receiving plate 34 and thus the heat of the second heat receiving plate 34 is absorbed. The operating fluid (in the gaseous state) liquefies in the other end portion 39C connected to the second heat sink 37 and the heat absorbed in the second heat pipe 39 is released to the second heat sink 37.

In the portable computer 11 of the first embodiment, the heat generated from the first heat generating member 32A is transferred to the first heat sink 36 via the first heat receiving plate 33 and the heat pipe 38. The heat transferred to the first heat sink 36 is propagated to the air sent from the fan unit 35, and the air is discharged to the outside of the cabinet 16 from exhaust holes 48 shown in FIG. 2. Similarly, the heat generated from the second heat generating member 32B is transferred to the second heat sink 37 via the second heat receiving plate 34 and the heat pipe 39. The heat transferred to the second heat sink 37 is propagated to the air sent from the fan unit 35, and the air is discharged to the outside of the cabinet 16 from exhaust holes 48.

Here, it should be noted that the portable computer 11 of this embodiment can be used in either one of the following positions, that is, the first position PI where the cabinet 16 is placed in a horizontal state as indicated by two-dot dashed lines in FIG. 5 and the second position P2 where the cabinet 16 is placed in an inclined state with respect to the horizontal direction as indicated by solid lines in FIG. 5. In the first position PI, the portable computer 11 is placed to extend in the horizontal direction, whereas in the second position P2, the portable computer 11 is set in such a manner that the back side opposite to the front direction F is raised.

In the state where the portable computer 11 is set in the first position P1, the first heat pipe 38 is positioned such that the first end portion 38B and the second end portion 38C are substantially leveled with each other in height. Further, the second heat pipe 39 is positioned such that the one end portion 39B and the other end portion 39C are substantially leveled with each other in height as well. With this structure, the top heat does not occur in the first heat pipe 38 or the second heat pipe 39.

The top heat is a phenomenon in which the circulation of the operation fluid does not occur, which occurs when the direction of the arrangement of the heat pipe is not appropriate. In general, the operation fluid gasifies to absorb the surrounding heat and moves in the heat pipe, and after that, liquefies to release the heat to the surrounding. The liquefied operation fluid passes through, for example, the inside of the heat sink and returns to the place where the gasification is carried out. However, in the case where the gasification place is located higher than the liquefying place, the liquefied operation fluid will not return to the gasification place and thus the heat is not transferred effectively. Such a phenomenon is called top heat.

In the case where the portable computer 11 is set in the second position P2, the first heat pipe 38 is positioned such that the first end portion 38B, where the gasification of the operation fluid is carried out, is located at a lower position than that of the second end portion 38C, where the gasified operation fluid is liquefied. Therefore, the top heat does not occur in the first heat pipe 38. On the other hand, the second heat pipe 39 is positioned such that the one end portion 39B, where the gasification of the operation fluid is carried out, is located at a higher position than that of the other end portion 39C, where the gasified operation fluid is liquefied. Therefore, it is necessary to return the liquefied operation fluid to the one end portion 39B from the other end portion 39C against gravity. The second heat pipe 39 of this embodiment contains the porous layer 46 serving as the conveying mechanism 45. With this structure, the liquefied operation fluid is returned to the one end portion 39B from the other end portion 39C by the capillary effect of the porous layer 46. In this manner, the top heat is prevented in the second heat pipe 39 as well.

The above is a description of the portable computer 11 of the first embodiment. According to this embodiment, the first end portion 38B of the first heat pipe 38 is located at a lower position than that of the second end portion 38C, and the one end portion 39B of the second heat pipe 39 is located at a higher position than that of the other end portion 39C. Further, the second heat pipe 39 includes the conveying mechanism 45, which conveys the liquefied operation fluid to the one end portion 39B from the other end portion 39C.

With this structure, when the portable computer 11 is set in the second position P2, the first end portion 38B of the first heat pipe 38 is located at a lower position than that of the second end portion 38C. Therefore, the occurrence of the top heat is prevented in the first heat pipe 38. On the other hand, the one end portion 39B of the second heat pipe 39 is located at a higher position than that of the other end portion 39C, the second heat pipe 39 is positioned where the top heat would occur. However, the second heat pipe 39 includes the conveying mechanism 45, which conveys the liquefied operation fluid to the one end portion 39B from the other end portion 39C. Thus, the situation where there is no more operating liquid in the one end portion 39B can be prevented. In this manner, the occurrence of the top heat can be prevented in the second heat pipe 39 as well. In the meantime, when the portable computer 11 is set in the first position P1 where it is placed horizontally, the first heat pipe 38 and the second heat pipe 39 are not inclined, and therefore the top heat does not occur in either one of the pipes. As described above, the occurrence of the top heat can be prevented in both situations where the portable computer 11 is set in the first position P1 and where it is in the second position P2, and thus the first heat generating member 32A and the second heat generating member 32B can be cooled down efficiently. Further, with the second heat pipe 39 provided, the occurrence of the top heat can be prevented, and therefore the degree of freedom in the layout of the heat pipe can be improved.

In this embodiment, the conveying mechanism 45 is made of the porous layer 46 provided on the inner circumferential portion of the second main body 39A, and the porous layer 46 includes a number of micro-pores 47 communicated to each other. With this structure, the conveying mechanism 45 exhibits the capillary effect and thus it can suck up the liquefied operation fluid. In this manner, the operation fluid can be conveyed in the direction against gravity without a necessity of a separate driving source such as a pump.

In this embodiment, the first heat pipe 38 includes inside the first main body 38A a plurality of groove portions 38D, and these groove portions 38D are formed to extend along the longitudinal direction of the first heat pipe 38. In this manner, the first heat pipe 38 can be made to have such a simple structure sufficient to convey the operation fluid. More specifically, the first heat pipe 38 including these groove portions 38D has the merits of being capable of conveying a larger amount of the operation fluid, being light in weight and lower in production cost as compared to the second heat pipe 39 including the conveying mechanism 45. On the other hand, although the second heat pipe 39 is inferior in the amount of the operation fluid conveyed, weight and production cost as compared to the first heat pipe 38, the second heat pipe 39 is resistant to inclination and can prevent the occurrence of the top heat as much as possible. In this embodiment, the first heat pipe 38 and the second heat pipe 39, which have structures different from each other, are used according to the relative positions of each of the first heat generating member 32A and second heat generating member 32B with respect to the fan unit 35 so as to make full use of each respective advantage. In this manner, the first heat generating member 32A and second heat generating member 32B can be cooled down efficiently.

In this embodiment, the porous layer 46 is formed by sintering a layer of metal particles applied on the inner circumferential portion of the second main body 39A. In this manner, the porous layer 46 containing a great number of micro-pores 47 inside can be simply formed. Here, in particular, when copper particles of the same properties as those used for the second main body 39A of the second heat pipe 39 are employed, excellent heat conductivity of copper can be exhibited.

A portable computer 61 according to the second embodiment will now be described with reference to FIGS. 6 to 9. The portable computer 61 of the second embodiment is of the so-called tablet type. The description will be made mainly with regard to parts different from those of the first embodiment. The common parts will be designated by the same references and the descriptions therefor will be omitted.

Figure 6:
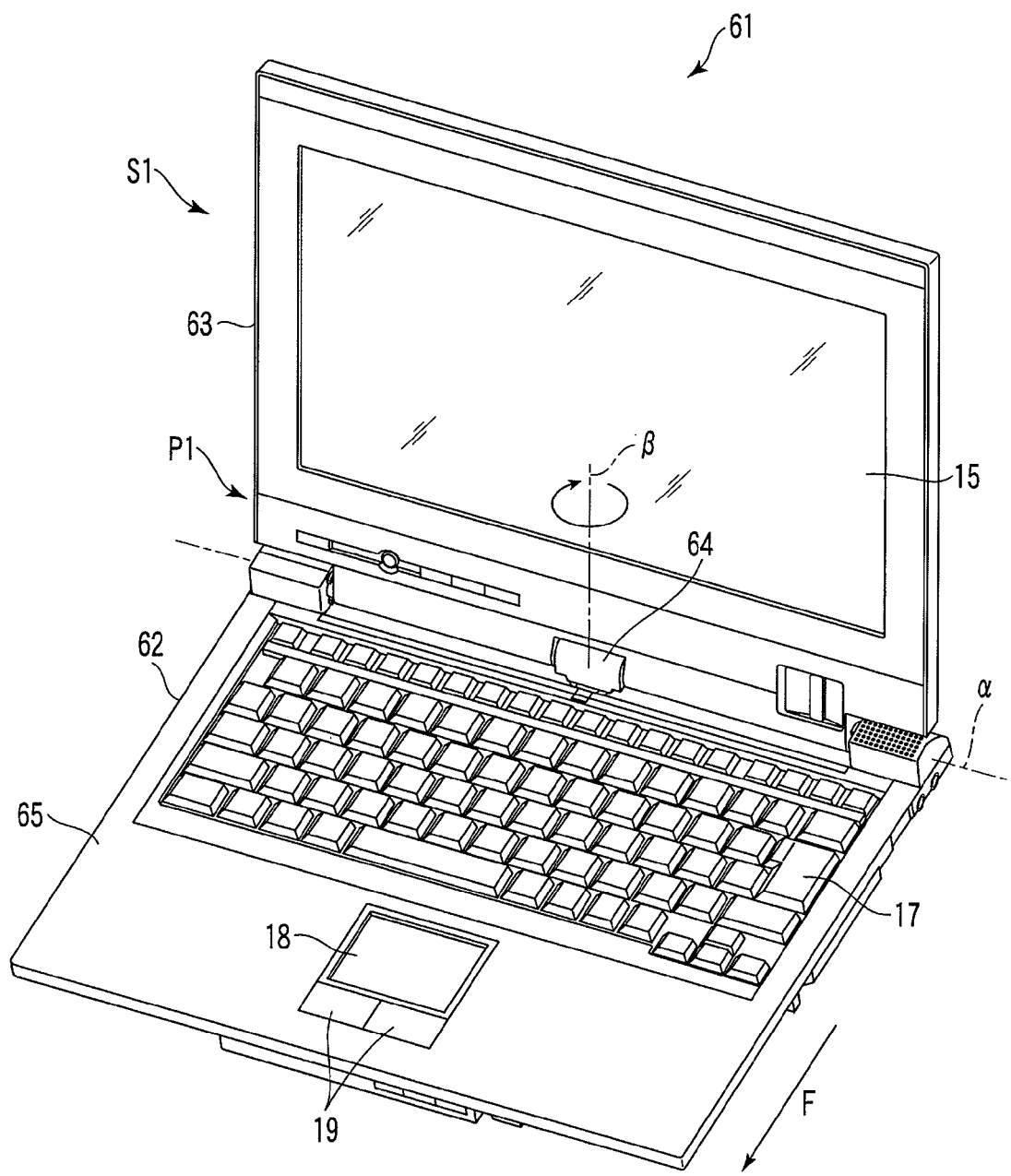
FIG. 6 is an exemplary perspective view of a portable computer which is an example of the electronic device according to the second embodiment.

As shown in FIG. 6, the portable computer 61, which is an example of the electronic device, includes a main body unit 62, a display unit 63 and a hinge mechanism 64 provided between the main body unit 62 and the display unit 63. The hinge mechanism 64 supports the display unit 63. With the hinge mechanism 64, the display unit 63 is hinged about an axis α with respect to the main body unit 62. Further, the display unit 63 is swiveled about an axis β with respect to the main body unit 62. As can be seen in FIG. 6, the forward direction F is as indicated on the side close to the operator. The portable computer 61 shown in this figure is in a first state S1 in which the display unit 63 is opened with respect to the main body unit 62.

Figure 7:
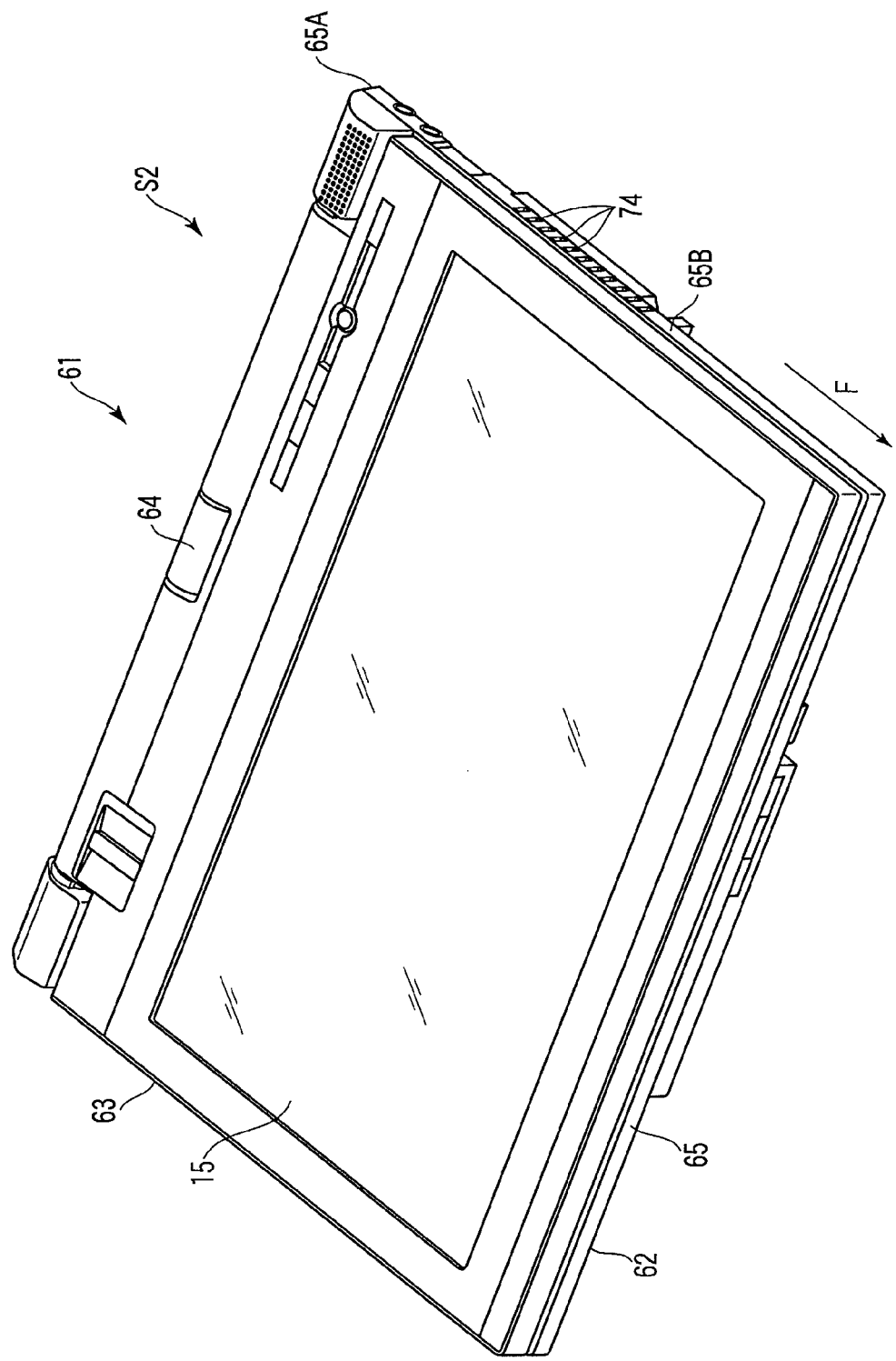
FIG. 7 is an exemplary perspective view of the portable computer shown in FIG. 6 set in a tablet state.
Figure 8:
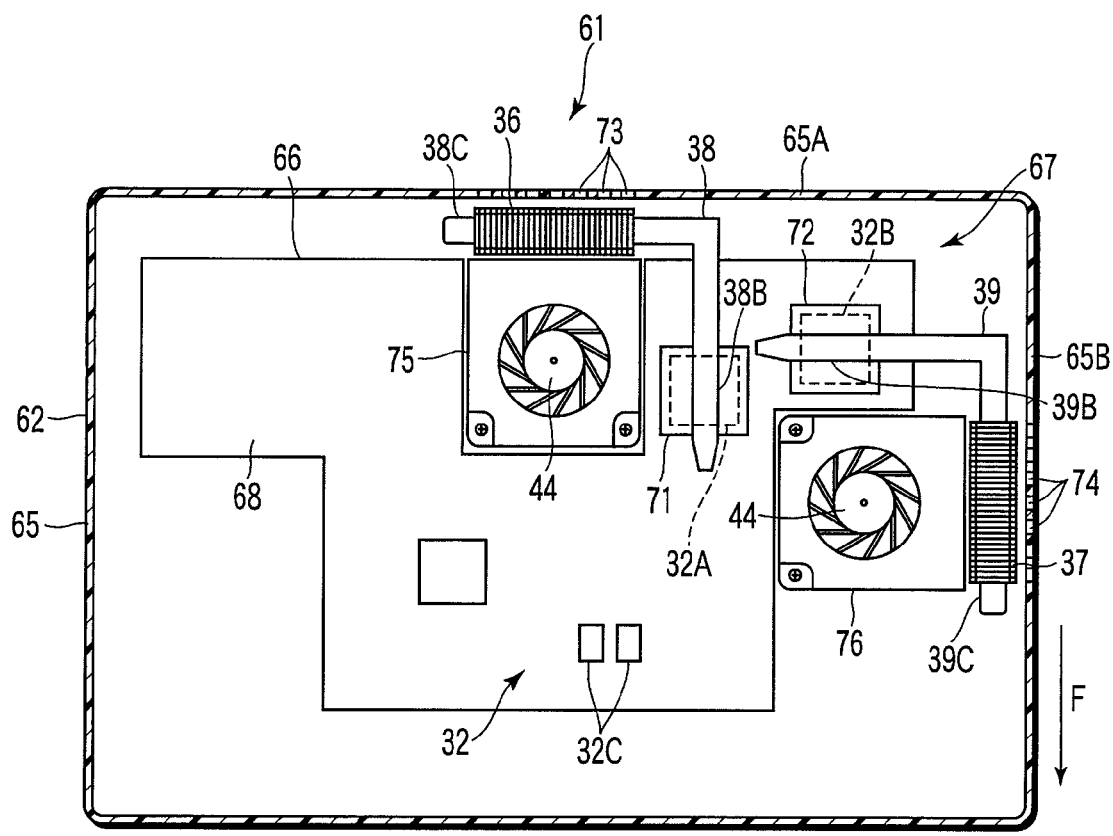
FIG. 8 is an exemplary cross sectional view of a cabinet of the portable computer shown in FIG. 6 when it is cut in its horizontal direction.

The display unit 63 includes a display 15. The display 15 is, for example, a liquid crystal display. As shown in FIG. 6, the main body unit 62 includes a resin-made cabinet 65, a keyboard 17, a touch pad 18, which is a pointing device, buttons 19, a printed circuit board 66 housed inside the cabinet 65 and a cooling device 67 that cools down a circuit component 32 of the printed circuit board 66. As shown in FIGS. 7 and 8, the cabinet 65 includes a rear wall portion 65A in which a first exhaust hole 73 is made, and a right wall portion in which a second exhaust hole 74 is formed.

As shown in FIG. 7, the display unit 63 can be folded flat into a so-called tablet state in which the display 15 covers the main body unit 62 while the display 15 facing upwards. In other words, the portable computer 61 is in the second state S2 in which the display unit 63 covers the main body unit 62 while exposing the display 15 to outside. In the tablet state, the screen of the display 15 can be displayed in a 90-degree rotated state in the clockwise direction with respect to the screen in the state shown in FIG. 6. In this embodiment, the switching of the screen display such is automatically carried out depending on the position of the display 15. It is alternatively possible here to provide a switch separately for this operation, and switch the screen display by operating it.

As can be seen in FIG. 8, the printed circuit board 66 includes a printed wiring board 68 and a plurality of circuit parts 32 mounted on the printed wiring board 68. These circuit parts 32 includes a first heat generating member 32A, a second heat generating member 32B and other parts 32C. The first heat generating member 32A is, for example, a ball grid array (GBA) type semiconductor package, which contains a central processing unit (CPU) or the like. The second heat generating member 32B is, for example, a GBA type semiconductor package, which contains a graphic chip or the like.

The cooling device 67 is designed to cool down the first heat generating member 32A and the second heat generating member 32B of the circuit parts 32. The cooling device 67 includes a first heat receiving plate 71 thermally connected to the first heat generating member 32A, a second heat receiving plate 72 thermally connected to the second heat generating member 32B, a first fan unit 75 that promotes the cooling down of the first heat generating members 32A and a second fan unit 76 that promotes the cooling down of the second heat generating members 32B. The cooling device 67 further includes a first heat sink 36 provided in the vicinity of the first fan unit 75 and a second heat sink 37 provided in the vicinity of the second fan unit 76, a first heat pipe 38 which connect the first heat receiving plate 71 and the first heat sink 36 to each other and a second heat pipe 39 which connect the second heat receiving plate 72 and the second heat sink 37 to each other.

The first heat receiving plate 71 and the second heat receiving plate 72 are each made of a copper plate into a square shape. The first heat sink 36 and the second heat sink 37 are each formed of a plurality of square plate-like fins which are joined together. Each of the first fan unit 75 and the second fan unit 76 includes a fan main body 44, a motor that rotates the fan main body 44, and the like.

The first heat pipe 38 is designed to have the same form as that of the first embodiment and it includes a plurality of groove portions 38D inside the first main body 38A. The first heat pipe 38 is placed in the cabinet 65 to extend substantially in the horizontal direction. The first heat pipe 38 includes a first end portion 38B to be connected to the first heat generating member 32A and a second end portion 38C located in the neighborhood of the first fan unit 75. The second end portion 38C is connected to the first heat sink 36.

The second heat pipe 39 is designed to have the same form as that of the first embodiment. The second heat pipe 39 includes an end portion 39B to be connected to the second heat generating member 32B and another end portion 39C located in the neighborhood of the second fan unit 76. The other end portion 39C is connected to the second heat sink 37.

As can be seen in FIG. 4, the second heat pipe 39 includes a conveying mechanism 45. The conveying mechanism 45 is a porous layer 46 formed to have a predetermined thickness on an inner circumferential portion of the second main body 39A. The porous layer 46 has a number of micro-pores 47 which are communicated to each other. Thus, the operating liquid is allowed to pass through the micro-pores 47. The porous layer 46 is formed, for example, by sintering a layer of copper particles formed on the inner circumferential portion of the second main body 39A. The diameter of the micro-pores 47 of the second heat pipe 39 is extremely small as compared to the width of the groove portions 38D of the first heat pipe 38. With this structure, the second heat pipe 39 can exhibit a sufficient capillary effect as compared to the first heat pipe 38.

In the portable computer 61 of the first embodiment, the heat generated from the first heat generating member 32A is transferred to the first heat sink 36 via the first heat receiving plate 71 and the first heat pipe 38. The heat transferred to the first heat sink 36 is propagated to the air sent from the first fan unit 75, and the air is discharged to the outside of the cabinet 65 from first exhaust holes 73. Similarly, the heat generated from the second heat generating member 32B is transferred to the second heat sink 37 via the second heat receiving plate 72 and the second heat pipe 39. The heat transferred to the second heat sink 37 is propagated to the air sent from the second fan unit 76, and the air is discharged to the outside of the cabinet 65 from second exhaust holes 74.

Figure 9:
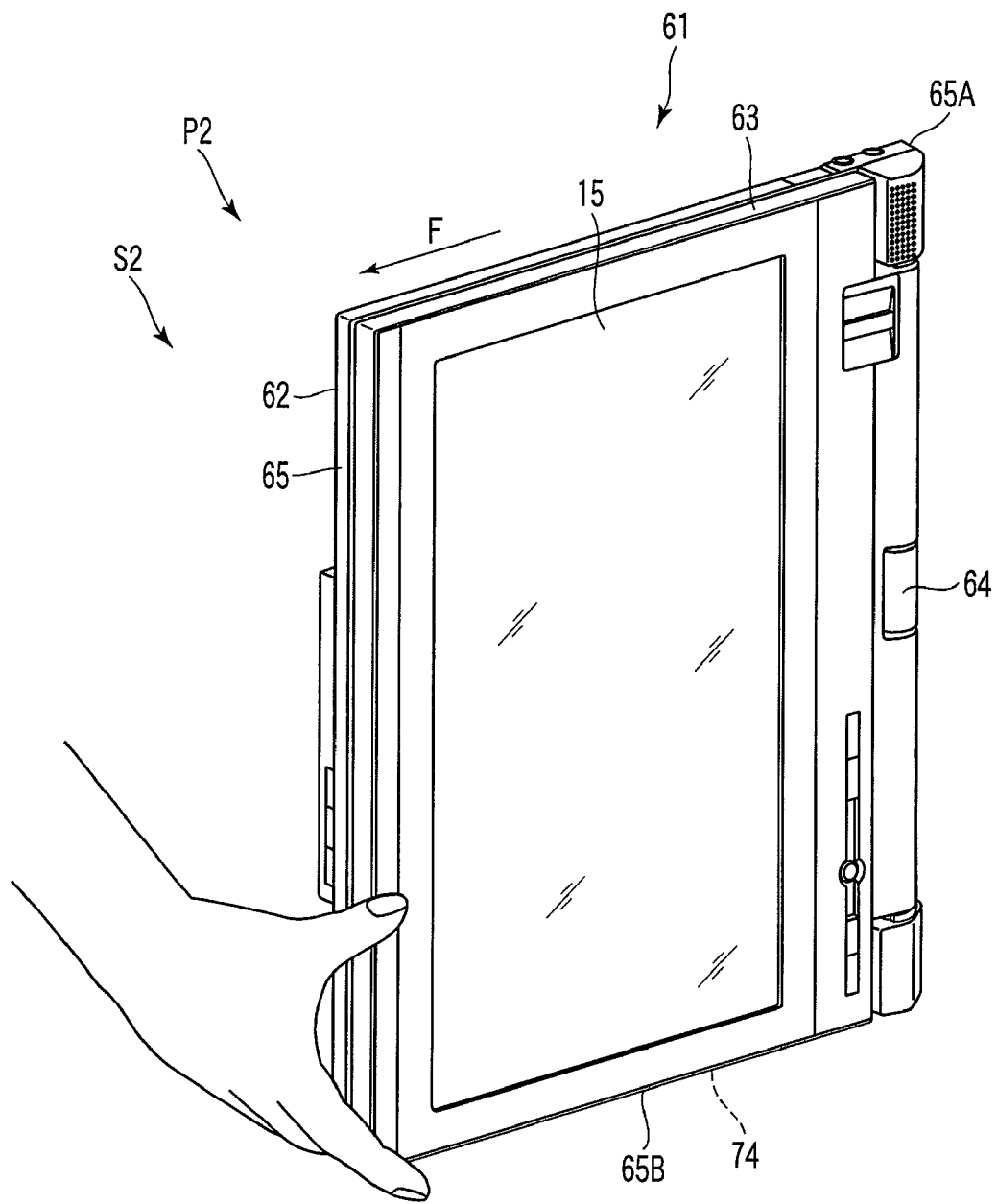
FIG. 9 is an exemplary perspective view of the portable computer shown in FIG. 6 set in the second position.

Here, it should be noted that the portable computer 61 of this embodiment can be used in either one of the following positions, that is, the first position P1 where the cabinet 65 is placed in a horizontal state as indicated in FIG. 6 and the second position P2 where the cabinet 65 is placed in an inclined state with respect to the horizontal direction, or a vertical state as indicated in FIG. 9. In the second position P2, the right wall portion 65B of the cabinet 65 is located on the lower side.

In the first position P1, the first heat pipe 38 is positioned such that the first end portion 38B and the second end portion 38C are substantially leveled with each other in height. Further, the second heat pipe 39 is positioned such that the one end portion 39B and the other end portion 39C are substantially leveled with each other in height as well. With this structure, the top heat does not occur in the first heat pipe 38 or the second heat pipe 39.

In the second position P2 shown in FIG. 9, the first heat pipe 38 is positioned such that the first end portion 38B, where the gasification of the operation fluid is carried out, is located at a lower position than that of the second end portion 38C, where the gasified operation fluid is liquefied. Therefore, the top heat does not occur in the first heat pipe 38. On the other hand, the second heat pipe 39 is positioned such that the one end portion 39B, where the gasification of the operation fluid is carried out, is located at a higher position than that of the other end portion 39C, where the gasified operation fluid is liquefied. Therefore, it is necessary to return the liquefied operation fluid to the one end portion 39B from the other end portion 39C against gravity. The second heat pipe 39 of this embodiment contains the porous layer 46 serving as the conveying mechanism 45. With this structure, the liquefied operation fluid is returned to the one end portion from the other end portion by the capillary effect of the porous layer.

That is, in the second embodiment, when the computer is folded in the tablet state and set in the second position P2, the second heat pipe 39 containing the porous layer 46 serving as the conveying mechanism 45 is located at the portion where the top heat may occur. An example of the heat pipe which may be brought in the top heat state is the one provided in the vicinity of the second exhaust holes 74 situated on the lower side.

According to the second embodiment, even in the case where the computer is used in a vertical state in which the right wall portion 65B of the cabinet 65 is located in the lower side, the occurrence of the top heat in the first heat pipe 38 and the second heat pipe 39 can be prevented. As described, when it is expected that the device is operated in a predetermined direction as in the case of the booklet type portable computer, it is preferable that the second heat pipe 39 including the conveying mechanism 45 should be situated at the section where the top heat should occur as in this embodiment.

The electronic device of the present invention is not limited to the portable computers, but it can be applied to some other electronic devices including portable information terminals. Further, the electronic device can be remodeled into various versions as long as the essence of the invention does not fall out of its scope. For example, in each of the above-described embodiments, the conveying mechanism 45 is formed of the porous layer 46 formed on the inner circumferential portion of the second main body 39A; however it may be realized by some other mechanism such as a pump.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
a cabinet;
a first heat generating member and a second heat generating member in the cabinet;
a fan unit configured to cool down the first heat generating member and the second heat generating member;
a first heat pipe comprising a first end portion thermally connected to the first heat generating member, a second end portion provided in a vicinity of the fan unit, a pipe-like first main body and a heat transfer fluid which changes its phase between gas and liquid contained in the first main body;
a second heat pipe comprising one end portion thermally connected to the second heat generating member and an other end portion provided in a vicinity of the fan unit, a pipe-like second main body and a heat transfer fluid which changes its phase between gas and liquid contained in the second main body,
wherein:
the first end portion of the first heat pipe is located at a position lower than that of
the second end portion and the one end portion of the second heat pipe is located at a position higher than that of the other end portion;
the second heat pipe comprises a transport mechanism configured to convey the heat transfer fluid upward from the lower end portion to the higher end portion,
the conveying mechanism comprises a porous layer provided on an inner circumferential portion of the second main body and the porous layer comprises a plurality of micro-pores connected to each other; and
the first heat pipe comprises a plurality of groove portions inside the first main body and the plurality of groove portions configured to extend along a longitudinal direction of the first heat pipe.

2. The electronic device of claim 1, wherein the porous layer is formed by sintering metal particles applied on the inner circumferential portion of the second main body.

3. The electronic device of claim 2, wherein the second main body of the second heat pipe and the porous layer are each formed of copper.

4. An electronic device comprising a display unit containing a display and a main body unit configured to support the display unit, the electronic device configured to shift its posture between a first state in which the display unit is configured to be open with respect to the main body unit and a second state in which the main body unit is configured to be covered with the display unit while the display unit is exposing the display to outside,
wherein the main body unit comprises:
a cabinet;
a first heat generating member and a second heat generating member in the cabinet;
a fan unit configured to promote cooling-down of the first heat generating member and the second heat generating member;
a first heat pipe comprising a first end portion thermally connected to the first heat generating member and a second end portion provided in a vicinity of the fan unit, a pipe-like first main body and a heat transfer fluid which changes its phase between gas and liquid contained in the first main body;
a second heat pipe comprising one end portion thermally connected to the second heat generating member and an other end portion provided in a vicinity of the fan unit, a pipe-like second main body and a heat transfer fluid which changes its phase between gas and liquid contained in the second main body,
and further wherein:
the first end portion of the first heat pipe is located at a position lower than that of the second end portion and the one end portion of the second heat pipe is located at a position higher than that of the other end portion;
the second heat pipe comprises a transport mechanism configured to convey the heat transfer fluid upward from the lower end portion to the higher end portion;
the conveying mechanism comprises a porous layer provided on an inner circumferential portion of the second main body and the porous layer comprises a plurality of micro-pores connected to each other; and
the first heat pipe comprises a plurality of groove portions inside the first main body and the plurality of groove portions configured to extend along a longitudinal direction of the first heat pipe.

5. The electronic device of claim 4, configured to be operated in either a first position where the device is placed in a horizontal state or a second position where the device is placed in an inclined state with respect to the horizontal state, wherein:
the cabinet comprises an exhaust hole, the exhaust hole configured to be on an lower side when the device is used in the second position; and
the second heat pipe is located in a vicinity of the exhaust hole.

6. An electronic device comprising:
a cabinet;
a first heat generating member and a second heat generating member housed inside the cabinet;
a fan unit configured to cool down the first heat generating member and the second heat generating member;
a first heat pipe comprising a first end portion thermally connected to the first heat generating member, a second end portion provided in a vicinity of the fan unit, and a first conveying mechanism;
a second heat pipe comprising one end portion thermally connected to the second heat generating member, an other end portion provided in a vicinity of the fan unit, and a second conveying mechanism different from the first conveying mechanism,
wherein:
the first end portion of the first heat pipe is located at a position lower than that of the second end portion, and the one end portion of the second heat pipe is located at a position higher than that of the other end portion;

the second conveying mechanism comprises a porous layer provided on an inner circumferential portion of the second main body and the porous layer comprises a plurality of micro-pores connected to each other; and the first heat pipe comprises a plurality of groove portions inside the first main body and the plurality of groove portions configured to extend along a longitudinal direction of the first heat pipe.

* * * * *